(12) United States Patent
Watanabe

(10) Patent No.: US 9,345,153 B2
(45) Date of Patent: May 17, 2016

(54) ELECTRONIC DEVICE

(75) Inventor: Yoshitaka Watanabe, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 279 days.

(21) Appl. No.: 13/981,247

(22) PCT Filed: Feb. 13, 2012

(86) PCT No.: PCT/JP2012/000929
§ 371 (c)(1),
(2), (4) Date: Jul. 23, 2013

(87) PCT Pub. No.: WO2012/114671
PCT Pub. Date: Aug. 30, 2012

(65) Prior Publication Data
US 2013/0301197 A1 Nov. 14, 2013

(30) Foreign Application Priority Data

Feb. 24, 2011 (JP) ................. 2011-038971

(51) Int. Cl.

| | |
|---|---|
| *H05K 7/02* | (2006.01) |
| *H05K 5/02* | (2006.01) |
| *H01M 2/10* | (2006.01) |
| *H04M 1/02* | (2006.01) |
| *H05K 5/03* | (2006.01) |

(52) U.S. Cl.
CPC ........... *H05K 5/0221* (2013.01); *H01M 2/1066* (2013.01); *H04M 1/0262* (2013.01); *H05K 5/03* (2013.01); *H04M 1/0214* (2013.01)

(58) Field of Classification Search
CPC ..... G06F 3/041; G06F 3/0488; G06F 1/1635; G06F 2203/04104; G06F 1/1632; G06F 1/1637; G06F 1/1647; G06F 1/1656; G06F 1/1692; G06F 1/1694; G06F 3/044; H05K 5/0221; H05K 7/02; H05K 5/0086; H05K 5/02; H05K 5/0208; H05K 5/03; H04M 1/0262; H04M 1/0214; H04M 2/1066
USPC ............. 361/679.01, 679.02, 679.08, 679.09, 361/679.21, 679.26, 679.27, 361/679.55–679.57, 724–727; 455/575.1–575.4; 379/433.11–433.13; 248/917–924

See application file for complete search history.

(56) References Cited

U.S. PATENT DOCUMENTS

| 8,257,859 B2* | 9/2012 | Xie et al. ..................... 429/151 |
| 2010/0028763 A1 | 2/2010 | Zhou et al. |
| 2010/0081045 A1 | 4/2010 | Li |

FOREIGN PATENT DOCUMENTS

| CN | 101964404 A | 2/2011 |
| JP | 2006-032089 A | 2/2006 |

(Continued)

OTHER PUBLICATIONS

Communication dated Nov. 26, 2014 from the State Intellectual Property Office of People's Republic of China in counterpart Application No. 201280010223.5.

(Continued)

*Primary Examiner* — Anthony Haughton
*Assistant Examiner* — Ingrid Wright
(74) *Attorney, Agent, or Firm* — Sughrue Mion, PLLC

(57) ABSTRACT

This smartphone (100) has a battery lid (60) attached to the smartphone main body, and a locking member (70) which is held so as to rotatable by the smartphone main body and which rotates in response to a force received from the battery lid (60) so as to engage the battery lid (60). As a result of the engaging of the battery lid (60) by the locking member (70), the battery lid (60) is locked to the smartphone main body via the locking member (70). When viewed in perspective view from the back side of the smartphone (100), it can be seen that a housing unit (43) for housing a battery pack (50) is provided upon a lower case assembly (40).

10 Claims, 23 Drawing Sheets

(56) References Cited

FOREIGN PATENT DOCUMENTS

| JP | 2007-335132 A | 12/2007 |
| JP | 2009-290832 A | 12/2009 |

OTHER PUBLICATIONS

Communication dated Feb. 15, 2016, issued by the European Patent Office in corresponding European Application No. 12749067.0.

* cited by examiner

ELECTRONIC DEVICE

CROSS REFERENCE TO RELATED APPLICATIONS

This application is a National Stage of International Application No. PCT/JP2012/000929 filed Feb. 13, 2012, claiming priority based on Japanese Patent Application No. 2011-038971, filed Feb. 24, 2011, the contents of all of which are incorporated herein by reference in their entirety.

TECHNICAL FIELD

The present invention relates to an electronic device, in particular a locking mechanism of a cover member for an electronic device body.

BACKGROUND ART

In recent years, electronic devices (for example, multifunctional mobile communication terminals such as smartphones) are achieving ever higher performance. In keeping with this trend, a locking structure that locks a battery cover onto a body for storing a battery pack in the body has been developed from various aspects.

For example, since an electronic device such as a smartphone is small in size and portable, the user may inadvertently drop the electronic device. Accordingly, it is strongly desired that the locking structure fully prevents the battery pack from jumping out of the device body.

Patent Literature 1 discloses a technique for further securing the fixed state of a battery cover. Specifically, as schematically shown in FIGS. 9 and 10 of Patent Literature 1, it discloses a structure in which the battery cover is attached to or removed from a housing by the rotation of a locking member 9. Note that FIG. 9 of Patent Literature 1 shows the unlocked state and FIG. 10 of Patent Literature 1 shows the locked state.

CITATION LIST

Patent Literature

Patent Literature 1: Japanese Unexamined Patent Application Publication No. 2009-290832

SUMMARY OF INVENTION

Technical Problem

In order to improve shock resistance, the cover should be strongly fixed to the housing as disclosed in Patent Literature 1. However, in this case, the user is forced to perform any work, such as to rotate the locking member.

As can be seen from the foregoing explanation, it is desired to facilitate attaching the cover member (battery cover) to the body. Note that the foregoing explanation in connection with the comparison with Patent Literature 1 is merely of an exemplary nature, and the technical scope of the present invention should not be narrowly construed on the basis of the explanation. An object of the present invention is to facilitate attaching the battery cover to the body. There is no intention to exclude employment of the locking mechanism of Patent Literature 1 in combination with an embodiment of the present invention.

Solution to Problem

An electronic device comprises a cover member that is attached to a body and a locking member that is rotatably held by the body, the locking member rotating in accordance with a force received from the cover member to engage with the cover member, wherein the engagement of the locking member with the cover member allows the cover member to be locked to the body through the locking member.

Advantageous Effects of Invention

According to the present invention, attaching the cover member (battery cover) to the body can be facilitated.

DESCRIPTION OF EMBODIMENT

Figure 1:
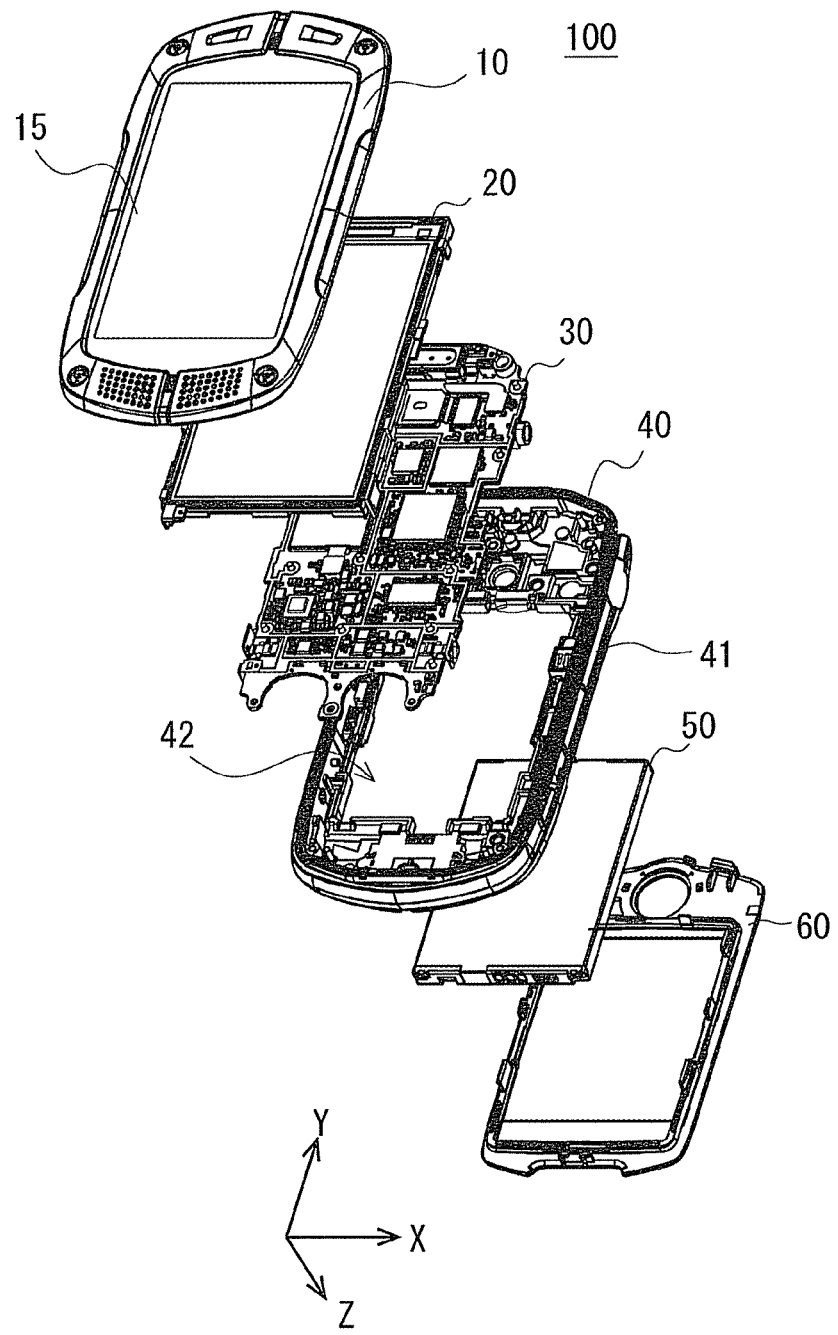
FIG. 1 is a schematic exploded perspective view of a smartphone according to a first embodiment.

In the following, with reference to the drawings, an embodiment will be explained. Specific structures shown in the embodiment are one aspect of the invention, and not to be construed in a limited manner on the basis of any specific disclosure or explanation of the embodiment. The drawings are used for the sake of explanation. Therefore, they may be simplified as appropriate and may not reflect exact dimensions or the like.

First Embodiment

As will become apparent from the following explanation, a smartphone 100 (see FIGS. 1 to 4) according to the present embodiment includes a battery cover 60 attached to a body, and a locking member 70 that is rotatably held by the body and that rotates in accordance with a force received from the battery cover 60 to engage with the battery cover 60. This structure can facilitate attaching the battery cover 60 to the body. Note that the term "the body" of the smartphone 100 should be construed in a broad sense, and the body is not necessarily completed.

According to the present embodiment, the user is saved the trouble of manually switching the locking apparatus from the unlocked state to the locked state after the battery cover 60 is attached to the smartphone body, and the locking apparatus will not be left in such an unlocked state. Thus, the smartphone 100 according to the present embodiment is made with due consideration of the actual usage manner of the user, and exhibits effects in addition to the facilitated attachment work. For example, as will become apparent from the following explanation, since the locking apparatus is built into the smartphone 100, the locking apparatus is prevented from being unintentionally switched from the locked state to the unlocked state. Further, since the locking apparatus is located inside the smartphone 100, flexibility in designing the smartphone 100 can be increased. Note that the effects explained in connection with the embodiment are merely of an exemplary nature, and the technical scope of the present invention should not be narrowly construed on the basis of the explanation.

In the following, with reference to the drawings, the first embodiment will be explained more specifically. As schematically shown in FIG. 1, the smartphone (mobile communication terminal (electronic device)) 100 includes a top case assembly 10, a display assembly 20, a circuit board assembly 30, a bottom case assembly 40, a battery pack 50, and a battery cover (cover member) 60.

The top case assembly 10 is an integrated component that is made up of a touch panel 15, which protects the display portion of the display assembly 20, and a top side case (a molded product made of resin or the like). The display assembly 20 is a composite component that includes a display component such as an LCD (Liquid Crystal Display) and the like. The circuit board assembly 30 is a composite component in which circuit elements (a processor, a memory, logic chips, capacitors, LEDs and the like) are mounted on an insulating substrate. The bottom case assembly 40 is a component in which lines, connection terminals and the like are integrated with a bottom side case (a molded product made of resin or the like). The battery pack 50 is a flat plate-like member into which a secondary battery is built, and to the exterior of which a plurality of external connection terminals are provided. The battery cover 60 is a molded product made of resin or the like.

Note that the touch panel 15 provided to the top case assembly 10 is, for example, of the capacitive type, and detects the position where a manipulation instruction from the user is input based on the detection of a change in the capacitance, which is caused by a touch pen or the user's finger touching the touch panel 15. Note that, though the position detection carried out by the touch panel 15 is executed by a dedicated circuit installed in the touch panel 15, the present invention is not limited thereto and the position detection may be executed by a circuit in the circuit board assembly 30. On the display such as the LCD provided to the display assembly 20, arbitrary images such as icons for receiving an input of a manipulation instruction from the user are displayed. Based on the touched position detected by the touch panel 15, the smartphone 100 senses whether or not any of the icons shown on the display is selected by the user. Then the smartphone 100 executes a prescribed process indicated by the icon in accordance with the sensing that the icon is selected. Note that the process executed by the smartphone 100 is realized by a central processing unit (CPU), which is mounted on the circuit board assembly 30, executing a program. During such software processing, peripheral devices (a transmitter, a receiver, and various sensors) and the like mounted on the circuit board assembly 30 are driven under control.

As shown in FIG. 1, the bottom case assembly 40 is a member having a frame portion 41 in a rectangular shape as seen from above. The bottom case assembly 40 further has a storage portion 42 for storing the circuit board assembly 30 and the display assembly 20. After the circuit board assembly 30 and the display assembly 20 are assembled into the top case assembly 10, the top case assembly 10 is screwed to the bottom case assembly 40. The top case assembly 10 being screwed to the bottom case assembly 40 allows the circuit board assembly 30 and the display assembly 20 to be stored in the housing. Note that the housing of the smartphone 100 is mainly structured by the top case assembly 10, the frame portion of the bottom case assembly 40, and the battery cover 60.

Figure 2:
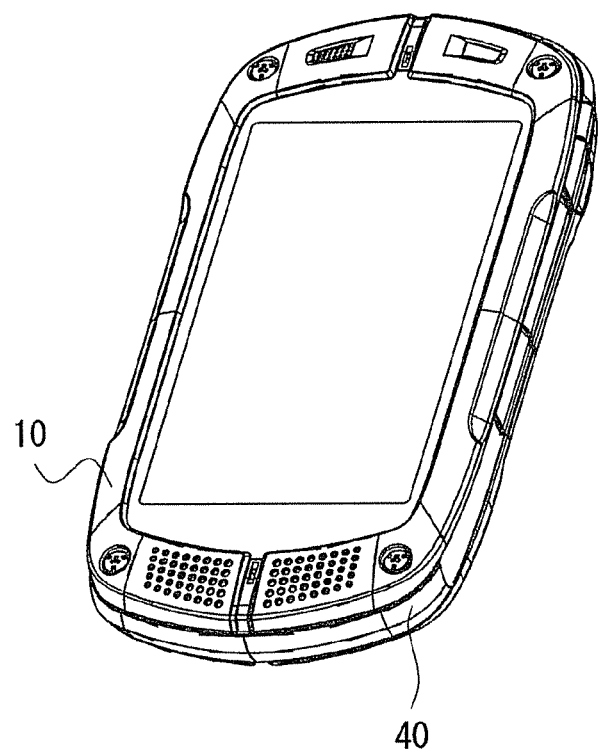
FIG. 2 is a schematic front perspective view of the smartphone according to the first embodiment.
Figure 3:
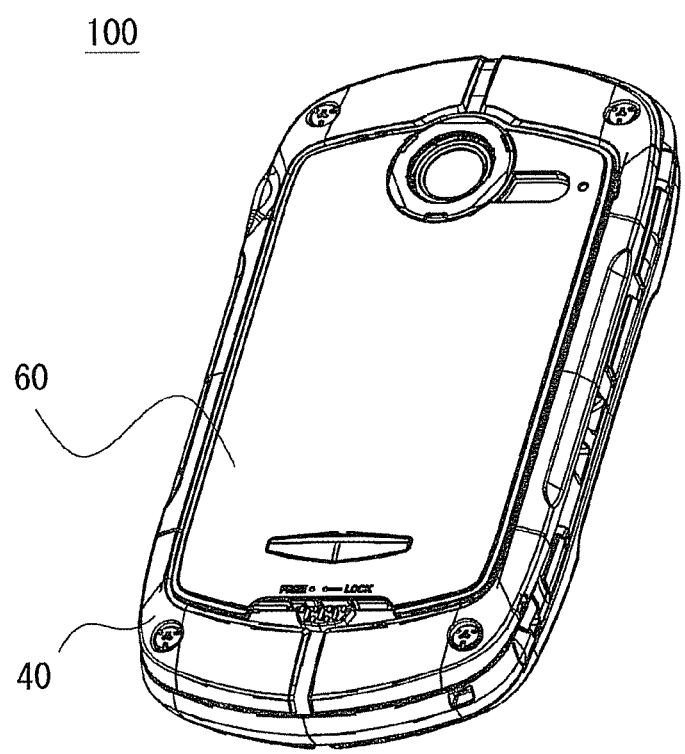
FIG. 3 is a schematic back perspective view of the smartphone according to the first embodiment.

As schematically shown in FIGS. 2 and 3, the constituent components of the smartphone 100 shown in FIG. 1 in an exploded and perspective view are stacked and integrated. Note that, as is well known, the smartphone 100 is a portable small-sized computer that has the Internet wireless connection function and the like, in addition to the mobile phone function. Note that the locking mechanism, which will be explained later, is also applicable to electronic devices other than the smartphone.

Figure 4:
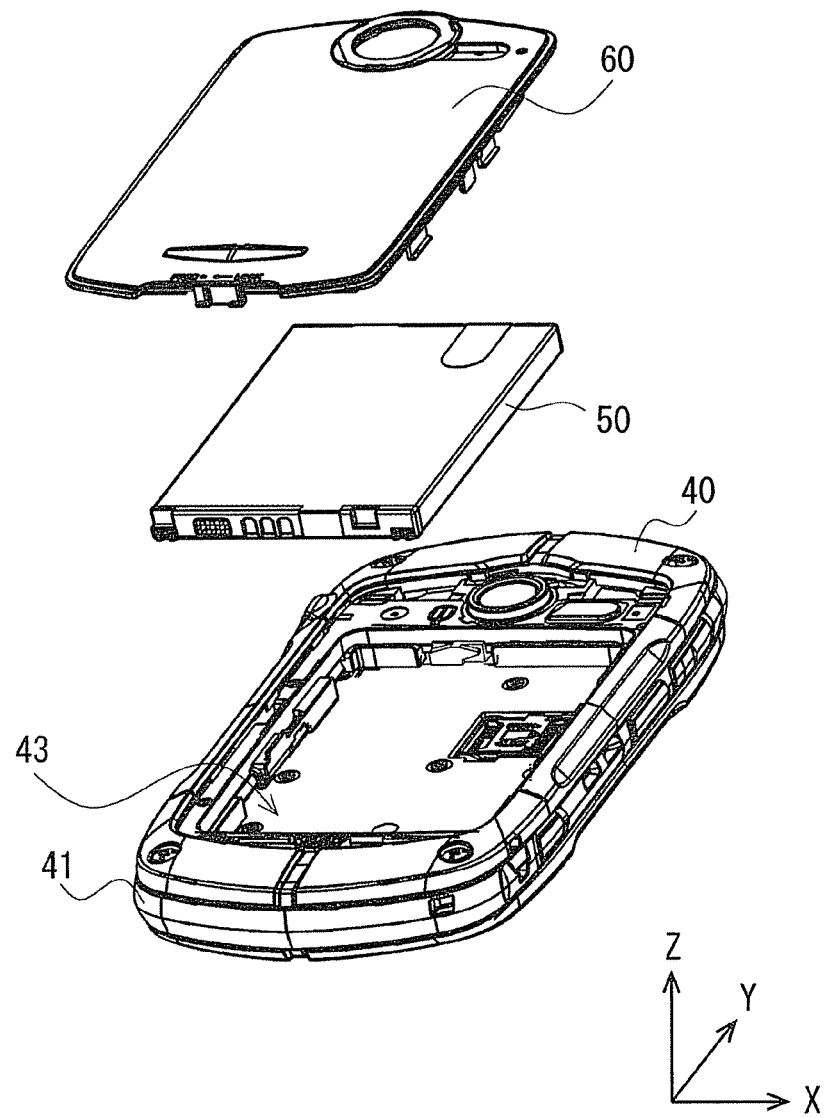
FIG. 4 is a schematic partially exploded perspective view of the smartphone according to the first embodiment.

As shown in FIG. 4, the bottom case assembly 40 has a storage portion 43 for storing the battery pack 50. The battery pack 50 is attached to the storage portion 43 of the bottom case assembly 40, and the position of the battery pack 50 is fixed thereto. In this state, by the battery cover 60 being pressed against the bottom case assembly 40, the battery cover 60 is locked to the bottom case assembly 40 through the locking member 70. Thus, the battery pack 50 is stored in the smartphone 100.

The electrical connection between the battery pack 50 and the circuit board assembly 30 can be secured in any manner. For example, by the battery pack 50 being disposed in the storage portion 43 of the bottom case assembly 40, the battery pack 50 is electrically connected to the circuit board assembly 30 via the bottom case assembly 40. That is, the external connection terminals of the battery pack 50 and the connection terminals of the bottom case assembly 40 are brought into contact with each other or the like, whereby an electrical connection is established between them. Thus, power is supplied from the battery pack 50 to the circuit board assembly 30 through the lines provided to the bottom case assembly 40. Power may be directly supplied from the battery pack 50 to the circuit board assembly 30.

According to the present embodiment, by the battery cover 60 being pushed into the bottom case assembly 40, the battery cover 60 is locked to the bottom case assembly 40. Thus, it becomes possible to facilitate attaching the battery cover 60 to the bottom case assembly 40, that is, the body of the smartphone 100. In this case also, the battery cover 60 is prevented from jumping out of the bottom case assembly 40, which may otherwise be caused by the shock associated with the smartphone 100 being dropped or the like. Therefore, the shock resistance of the smartphone 100 will not be impaired. As a result, it becomes possible to facilitate attaching the battery cover of the smartphone 100 without impairing the shock resistance of the smartphone 100.

Note that, when the smartphone 100 is subjected to the drop test and the deformation process of the smartphone 100 is observed with a high-speed camera or the like, the smartphone 100 may be deflected, e.g., bowed, in some cases. In such cases, since deflection of the battery pack 50 is small relative to that of the bottom case assembly 40, the battery pack 50 may jump out of the bottom case assembly 40. In order to prevent the battery pack 50 from jumping out, it is desirable that the battery cover 60 is strongly fixed to the bottom case assembly 40.

Taking into consideration of the power consumption of the smartphone 100 not being small, it is expected that the battery pack will be further increased in size in the future. It is considered that such an increase in the size of the battery pack in turn invites an increase in a force that urges the battery pack to jump out of the body, which force occurs upon receipt of the drop shock. According to the present embodiment, as described above, attaching the battery cover 60 of the smartphone 100 can be facilitated without impairing the shock resistance of the smartphone 100. Thus, an increase in the size of the battery pack in the future can also be addressed.

In the following, with reference to FIGS. 5A to 24, the locking mechanism that locks the battery cover 60 to the bottom case assembly 40 will be explained in detail.

Figure 5A:
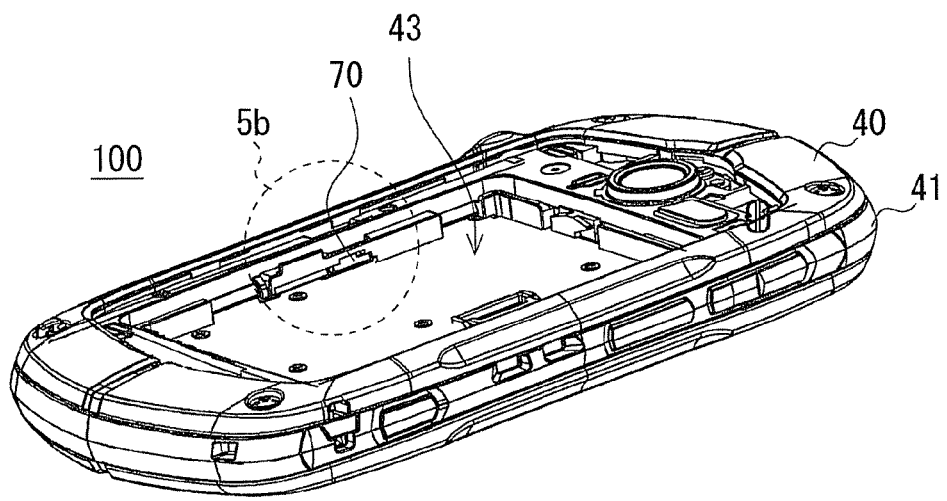
FIG. 5A is a schematic perspective view showing an attachment portion of a locking member according to the first embodiment.
Figure 5B:
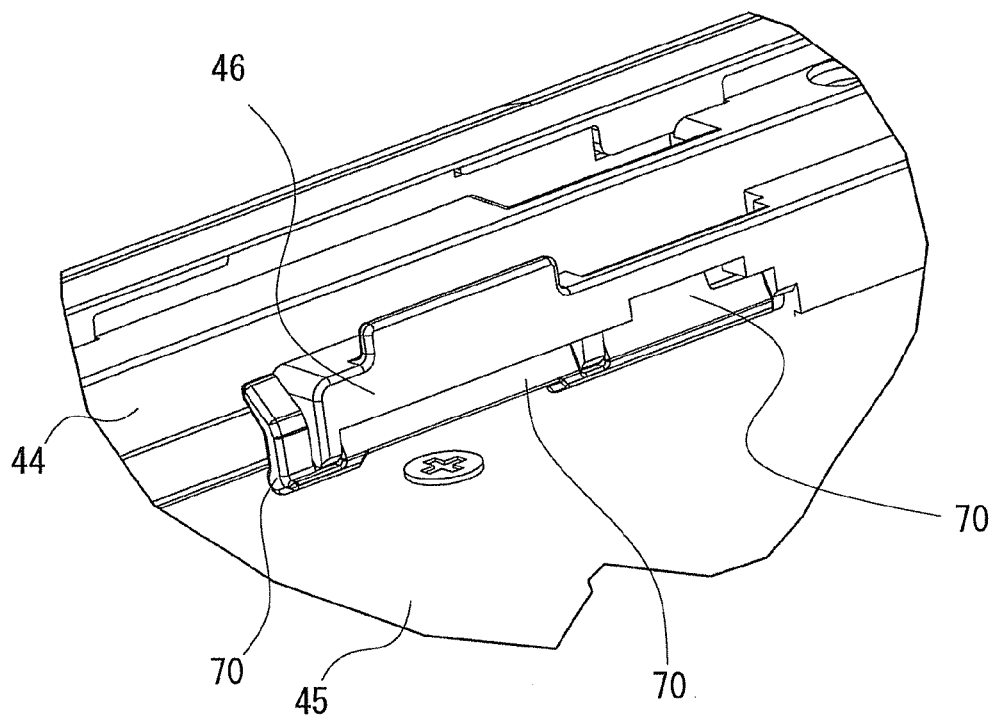
FIG. 5B is a schematic perspective view showing the attachment portion of the locking member according to the first embodiment.

As shown in FIG. 5A, the locking member 70 is disposed in the concave storage portion 43 provided to the bottom case assembly 40. FIG. 5B is a partial enlarged view showing around the area enclosed by a dashed circle shown in FIG. 5A. As shown in FIG. 5B, at a side face 44 of the storage portion 43, a holding portion 46 that pivotally holds the locking member 70 is provided. The locking member 70 is inserted into the clearance between a bottom face 45 of the storage portion 43 and the holding portion 46. Further, the locking member 70 is pressed from above on the bottom face 45 by the holding portion 46 so as to be retained. In this manner, the locking member 70 is rotatably disposed in the storage portion 43.

Figure 6:
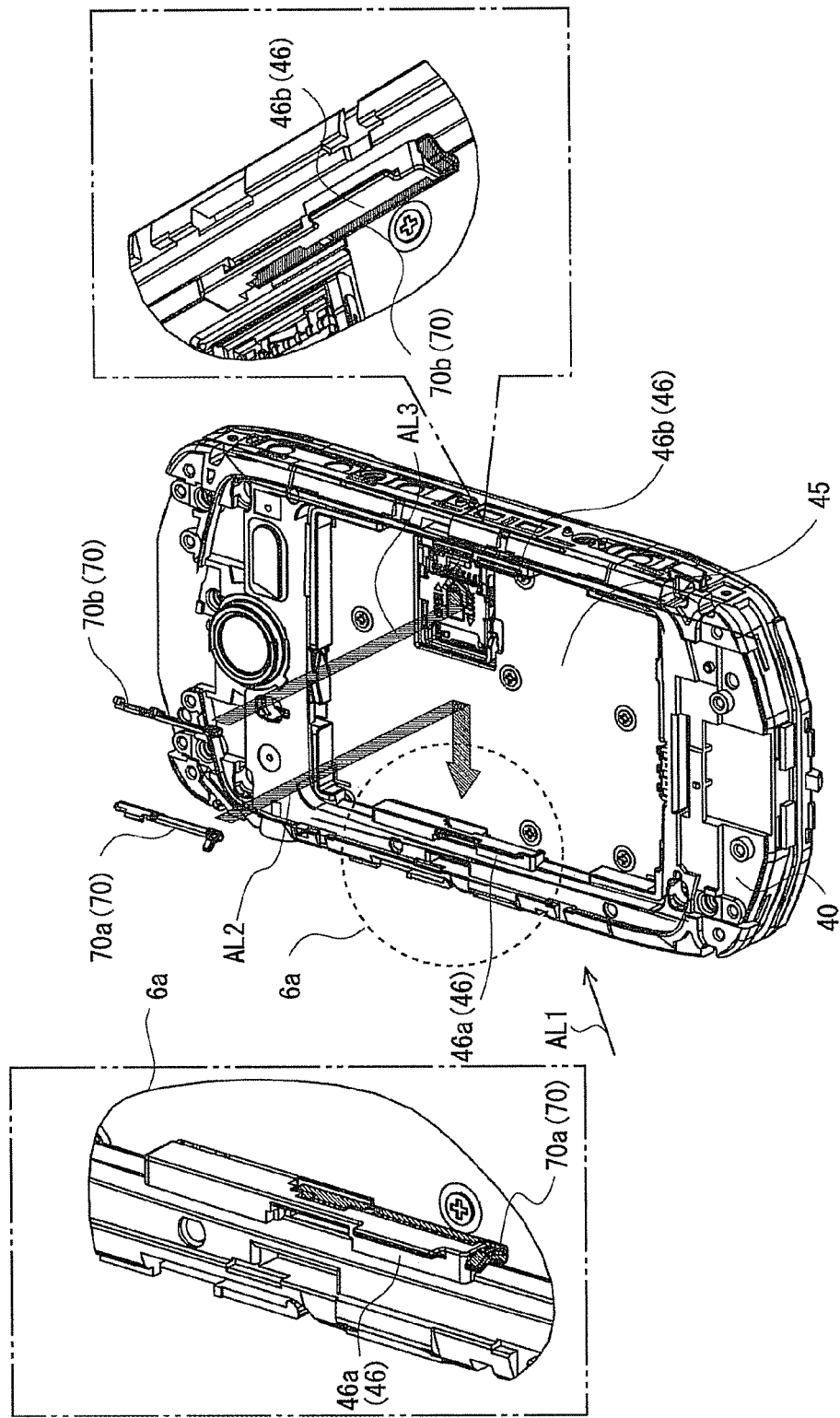
FIG. 6 is a schematic diagram showing an attaching manner of the locking member according to the first embodiment.

As schematically shown in FIG. 6, in order to improve adhesion of the battery cover 60 to the bottom case assembly 40, a pair of locking members 70a and 70b are disposed at the positions opposing to each other. As schematically indicated by arrow AL2, the locking member 70a is attached to the smartphone body. As schematically indicated by arrow AL3, the locking member 70b is attached to the smartphone body. Note that the central portion in FIG. 6 is a perspective view as seen from the direction along arrow AL1. The portion in the alternate long and two short dashes line in FIG. 6 corresponds to an enlarged perspective view of the area around the locking member.

As can be seen from the enlarged view in FIG. 6, the locking member 70a is held by a holding portion 46a, and the locking member 70b is held by a holding portion 46b. By the locking member 70 being fitted into the clearance between the holding portion 46 and the bottom face 45, the locking member 70 is easily disposed inside the storage portion 43. Note that the locking members 70a and 70b are mirror symmetric members. For the purpose of avoiding repetition of explanation, the explanation of the members may be given focusing on one of them.

Figure 7:
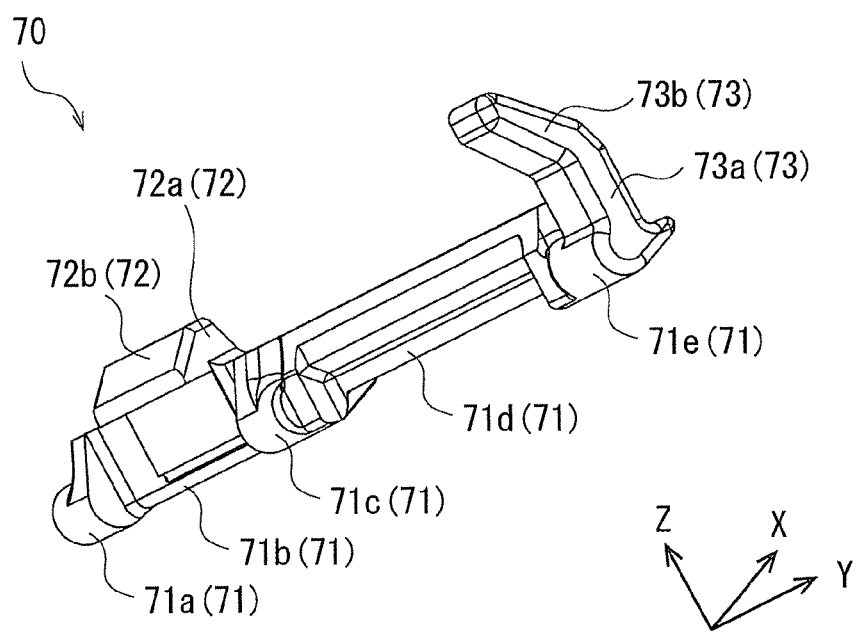
FIG. 7 is a perspective view of the locking member according to the first embodiment.

FIG. 7 is a perspective view of the locking member 70. FIGS. 8A to 8F are six plan views of the locking member. FIGS. 9A to 9C are each a partial cross-sectional view of the locking member.

As shown in FIG. 7, the locking member 70 is a shaft-like member whose longitudinal direction extends along the y-axis direction. The locking member 70 is held by the bottom case assembly 40 so as to be rotatable in the xz plane. As shown in FIG. 7, the locking member 70 has a shaft-like portion 71 extending along the y axis, a hook portion 72, and a receiving portion 73. The shaft-like portion 71 is a structure in which a ring-like portion 71a, an intermediate portion 71b, a ring-like portion 71c, an intermediate portion 71d, and a ring-like portion 71e are continuous. Provision of the ring-like portions 71a, 71c, and 71e makes it possible to enable or accelerate the rotation of the locking member 70 in the xz plane.

The hook portion 72 is provided to the intermediate portion 71b. The hook portion 72 is a portion that meshes (i.e., an engaging portion) with a hook portion (shown in FIG. 10) provided to the battery cover 60. By the hook portion 72 of the locking member 70 held by the bottom case assembly 40 and the hook portion provided to the battery cover 60 meshing with each other, the battery cover 60 is locked to the bottom case assembly 40 through the locking member 70. Note that, the hook portion 72 of the locking member 70 and the hook portion provided to the battery cover 60 meshing with each other may be referred to as the locking member 70 and the battery cover 60 fitting to each other. Further, this state may be simply referred to as the locked state. As is apparent to those skilled in the art, the state opposite to the locked state is the unlocked state.

As shown in FIG. 7, the receiving portion 73 is provided to the ring-like portion 71e. The receiving portion 73 receives a force from a projecting portion (shown in FIG. 10) provided to the battery cover 60. By the projecting portion provided to the battery cover 60 abutting on the receiving portion 73, the locking member 70 rotates in the direction becoming away from the battery pack 50. Thus, it becomes possible to secure the aforementioned meshing of the hook portions. Setting the rotation direction of the locking member 70 in the foregoing manner, a relatively simple locking mechanism can be implemented. It goes without saying that the rotation direction of the locking member 70 may be the reverse.

As shown in FIG. 7, the hook portion 72 has a base portion 72a and a tapered portion 72b. The tapered portion 72b becomes thinner as it becomes away from the base portion 72a. The specific shape of the hook portion 72 is not limited thereto and the hook portion 72 may be in any shape. As shown in FIG. 7, the receiving portion 73 is a bent shaped portion that has a standing portion 73a, an inclined portion 73b, and a bent portion 73c. The standing portion 73a and the inclined portion 73b extend along the z axis. Note that the extending direction of the standing portion 73a and the extending direction of the inclined portion 73b are different from each other. The specific shape of the receiving portion 73 is not limited thereto and the receiving portion 73 may be in any shape.

Figure 8A:
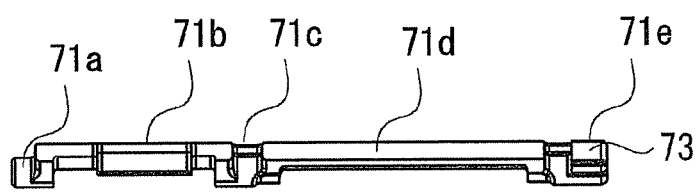
FIG. 8A is one of six plan views of the locking member according to the first embodiment.
Figure 8B:
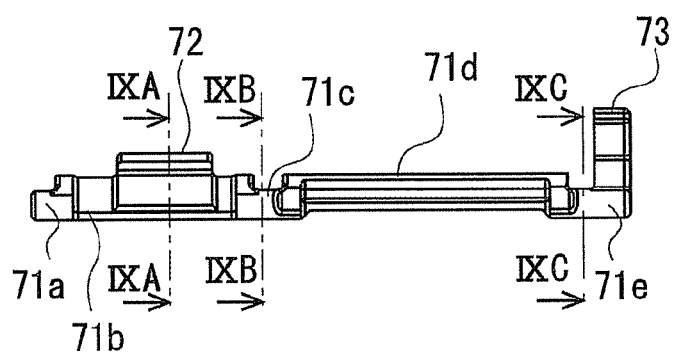
FIG. 8B is one of the six plan views of the locking member according to the first embodiment.
Figure 8C:
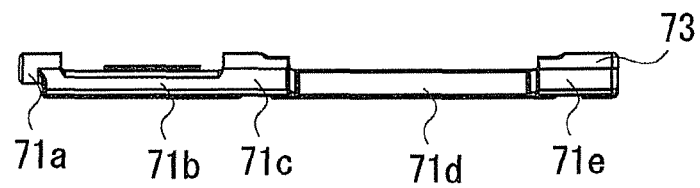
FIG. 8C is one of the six plan views of the locking member according to the first embodiment.
Figure 8D:
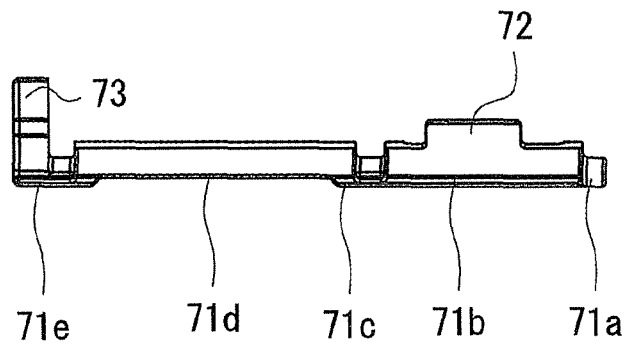
FIG. 8D is one of the six plan views of the locking member according to the first embodiment.
Figure 8E:
FIG. 8E is one of the six plan views of the locking member according to the first embodiment.
Figure 8F:
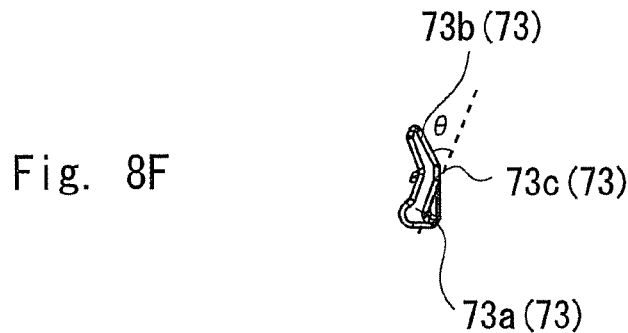
FIG. 8F is one of the six plan views of the locking member according to the first embodiment.
Figure 9A:
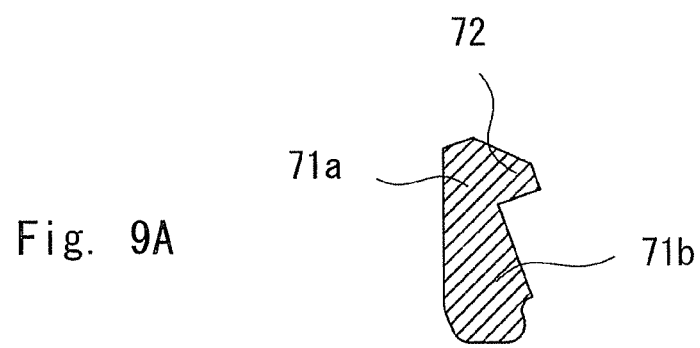
FIG. 9A is a cross-sectional view taken at a prescribed part of the locking member according to the first embodiment.
Figure 9B:
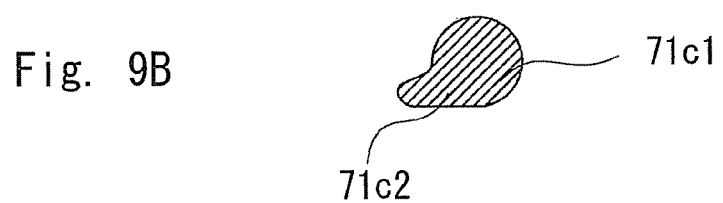
FIG. 9B is a cross-sectional view taken at a prescribed part of the locking member according to the first embodiment.
Figure 9C:
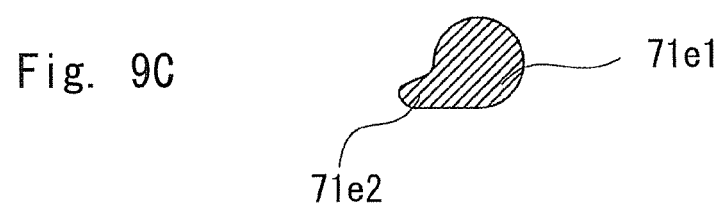
FIG. 9C is a cross-sectional view taken at a prescribed part of the locking member according to the first embodiment.

FIG. 8A is a top view of the locking member 70. FIG. 8B is an outer side view of the locking member 70. FIG. 8C is a bottom view of the locking member 70. FIG. 8D is an inner side view of the locking member 70. FIG. 8E is a front side view of the locking member 70. FIG. 8F is a rear side view of the locking member 70. Note that, in FIGS. 8A to 8F, it is regarded that the side where the battery pack 50 is present is the inner side and the opposite side is the outer side. Further, it is regarded that the side where the hook portion 72 is present is the front side and the side where the receiving portion 73 is present is the rear side. As can be grasped from FIG. 8F, an angle θ formed by the inclined portion 73b relative to the standing portion 73a is from 0 degrees to 90 degrees, e.g., in the range 40 to 60 degrees.

FIG. 9A is an end view taken along IXA-IXA in FIG. 8B. FIG. 9B is an end view taken along IXB-IXB in FIG. 8B. FIG. 9C is an end view taken along IXC-IXC in FIG. 8B. As shown in FIG. 9B, the ring-like portion 71c has the end face shape in which the outer circumference of a circular portion 71c1 is provided with a projection 71c2. As shown in FIG. 9C, the ring-like portion 71e has the end face shape in which the outer circumference of a circular portion 71e1 is provided with a projection 71e2. As will be explained later, the projections are provided for restricting the rotation range of the locking member 70. Such a restriction on the rotation range of the locking member 70 can effectively prevent the hooks from becoming out of mesh, which may otherwise be caused by excessive rotation of the locking member 70, for example.

Figure 10:
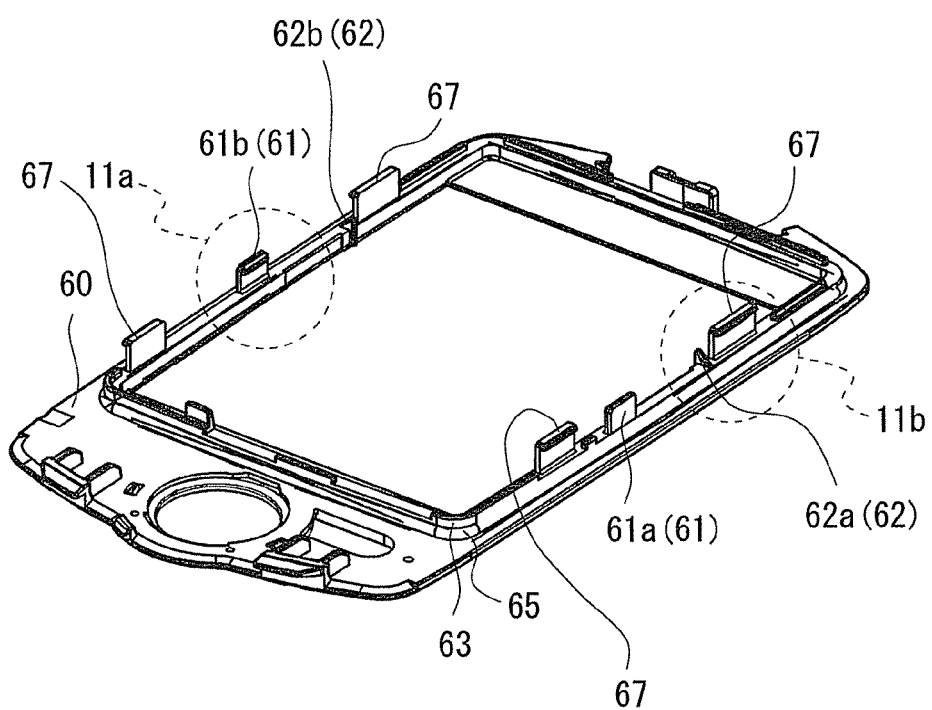
FIG. 10 is a schematic perspective view of a battery cover according to the first embodiment as seen from the inner side.

As shown in FIG. 10, the battery cover 60 is a flat plate-like member, and a hook portion (engaging portion) 61 and a projecting portion (pressing portion) 62 standing from the inner surface are disposed along the outer periphery of the battery cover 60 at certain intervals. The hook portion 61 of the battery cover 60 is a portion that meshes with the hook portion 72 of the locking member 70. The projecting portion 62 of the battery cover 60 is a portion that abuts on the receiving portion 73 of the locking member 70 and that presses the receiving portion 73.

The battery cover 60 is provided with a convex portion 63 extending along the outer circumference of the battery pack 50. Thus, the position of the battery pack 50 is restricted by the convex portion 63 of the battery cover 60. Further, the outer circumference of the convex portion 63 of the battery cover 60 is provided with a ring-like sealing member 65 such as an O ring. The sealing member 65 is interposed between the battery cover 60 and the bottom case assembly 40, so as to be retained by them in a deformed shape. Thus, the water-tightness between the battery cover 60 and the bottom case assembly 40 is secured. Note that, as can be seen from FIG. 10, the outer circumference of the battery cover 60 is provided with a plurality of projections 67 that mesh with the bottom case assembly 40. The projections 67 are each a hook-like portion, and formed such that the hook is oriented toward the outer side, which is in contrast to the hook portion 61.

Figure 11A:
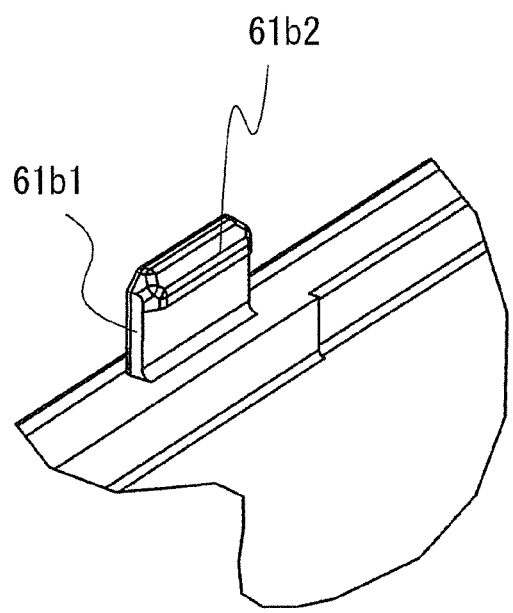
FIG. 11A is an enlarged perspective view of a structure provided to the battery cover according to the first embodiment.
Figure 11B:
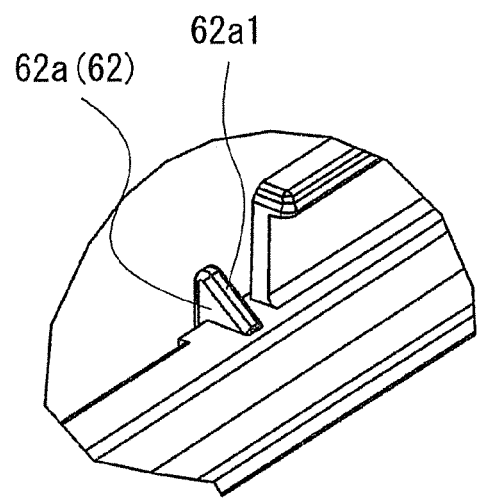
FIG. 11B is an enlarged perspective view of a structure provided to the battery cover according to the first embodiment.

FIG. 11A is an enlarged perspective view of the area around a dashed circle 11a shown in FIG. 10. FIG. 11B is an enlarged perspective view of the area around a dashed circle 11b shown in FIG. 10. As shown in FIG. 11A, the hook portion 61 has a standing portion 61b1 and a flange portion 61b2. The standing portion 61b1 extends along the push-in direction of the battery cover 60 relative to the bottom case assembly 40. The flange portion 61b2 extends from the top portion of the standing portion 61b1 to the inner side.

As shown in FIG. 11B, the projecting portion 62 (62a) is a triangular portion that extends along the push-in direction of the battery cover 60 relative to the bottom case assembly 40. As shown in FIG. 11B, the projecting portion 62a narrows as it extends upward. The projecting portion 62 (62a) has an inclined face 62a1 that inclines downward from the inner side toward the outer side.

Figure 12:
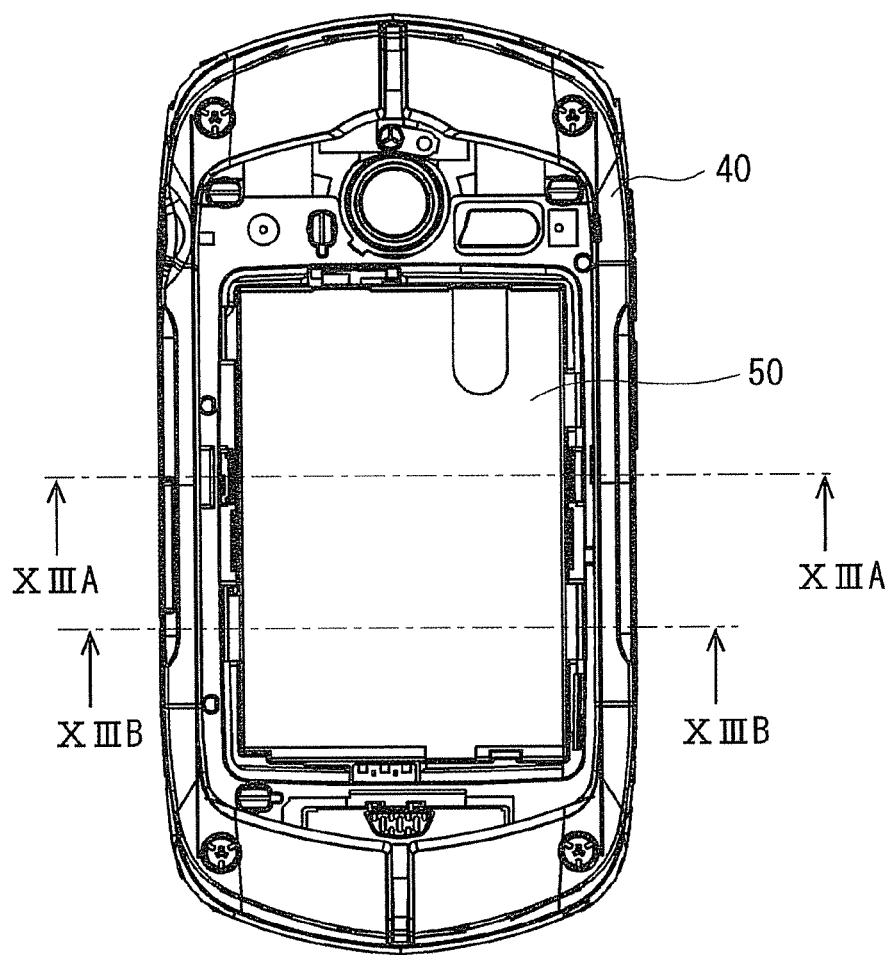
FIG. 12 is a schematic rear view of the smartphone before the battery cover according to the first embodiment is attached.
Figure 13A:
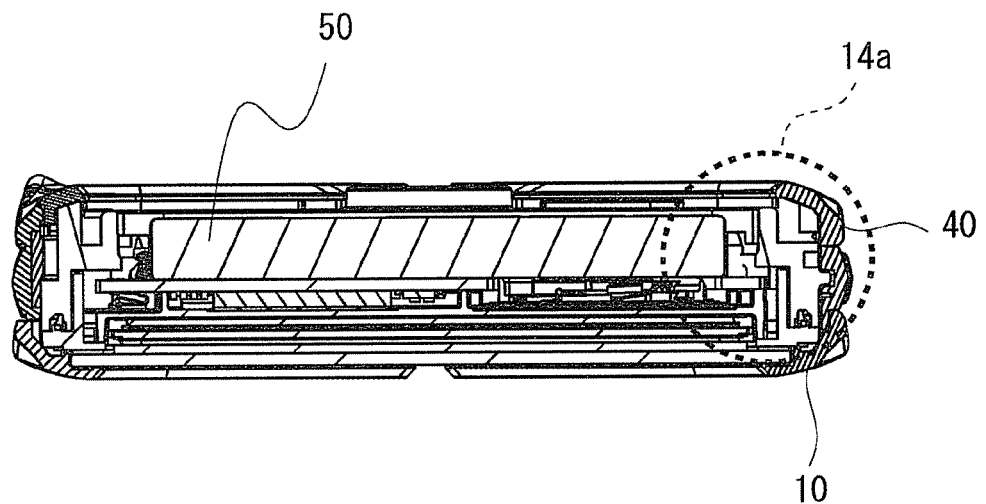
FIG. 13A is a schematic cross-sectional view of the smartphone according to the first embodiment.
Figure 13B:
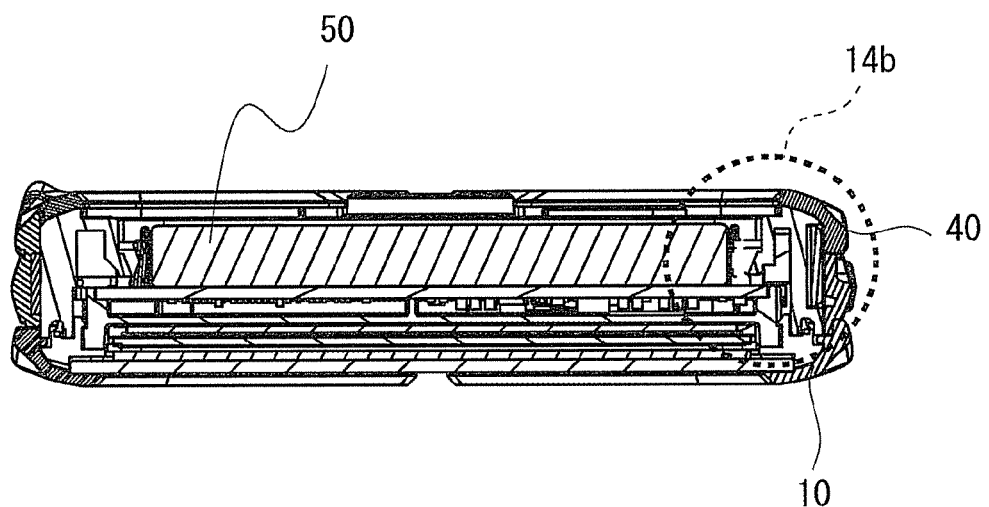
FIG. 13B is a schematic cross-sectional view of the smartphone according to the first embodiment.
Figure 14A:
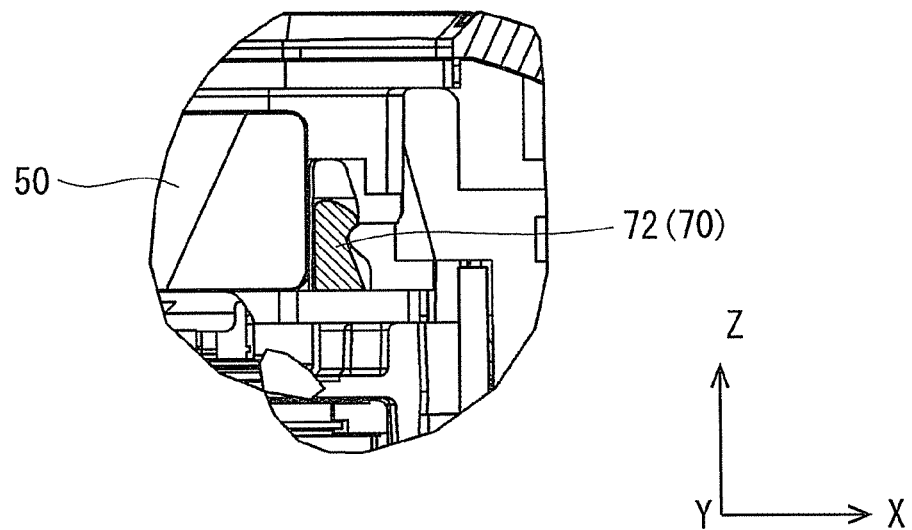
FIG. 14A is a schematic partially enlarged cross-sectional view of the smartphone according to the first embodiment.
Figure 14B:
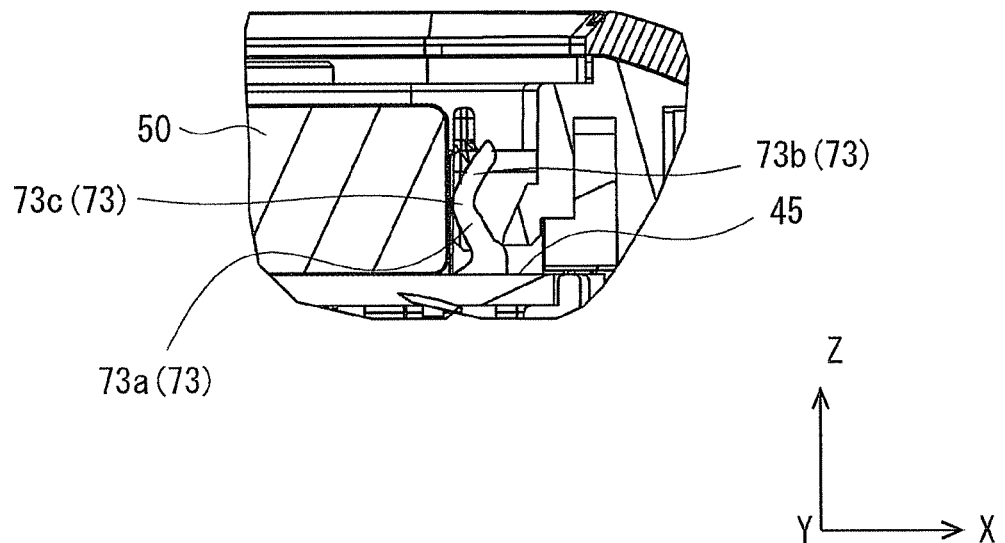
FIG. 14B is a schematic partially enlarged cross-sectional view of the smartphone according to the first embodiment.

The state before the battery cover 60 is pushed into the bottom case assembly 40 is shown in FIGS. 12 to 14B. Note that FIG. 13A is a schematic cross-sectional view taken along XIIIA-XIIIA in FIG. 12, and FIG. 13B is a schematic cross-sectional view taken along XIIIB-XIIIB in FIG. 12. FIG. 14A is a schematic enlarged view of the area around a dashed circle 14a shown in FIG. 13A, and FIG. 14B is a schematic enlarged view of the area around a dashed circle 14b shown in FIG. 13B.

Figure 15:
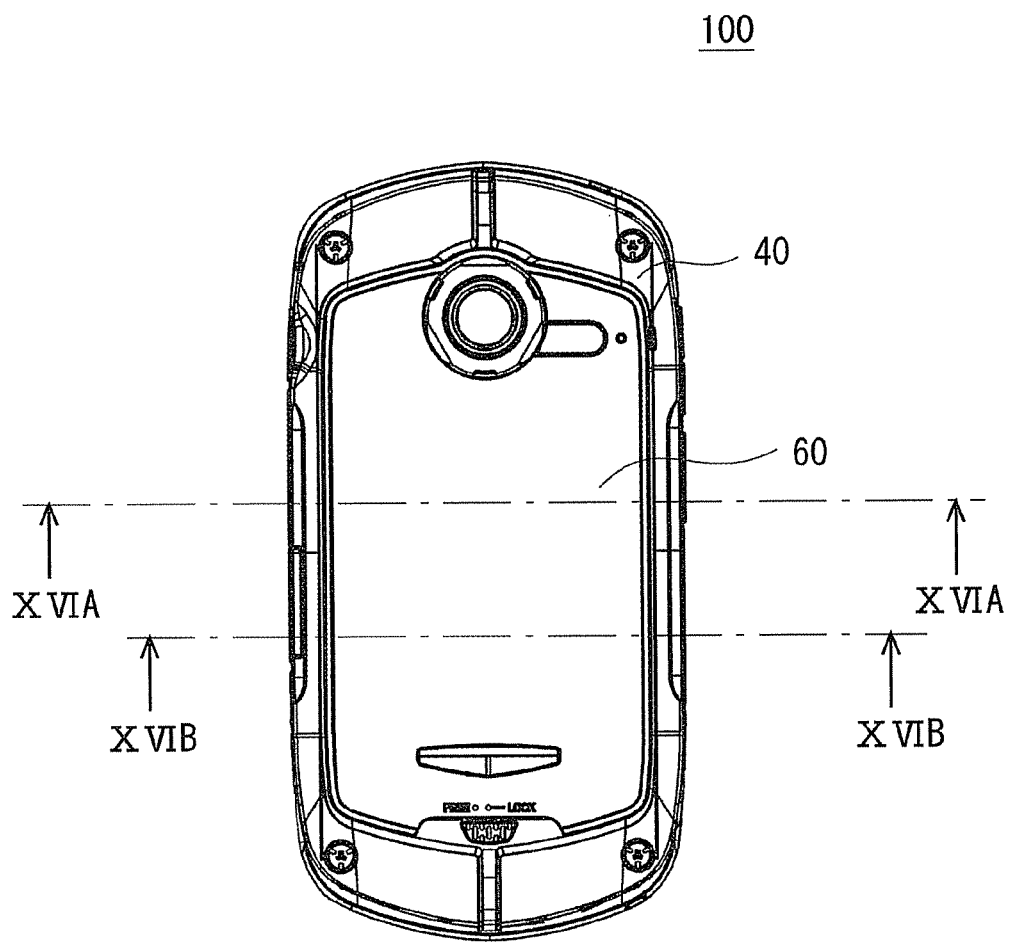
FIG. 15 is a schematic rear view of the smartphone in the process of attaching the battery cover according to the first embodiment.
Figure 16A:
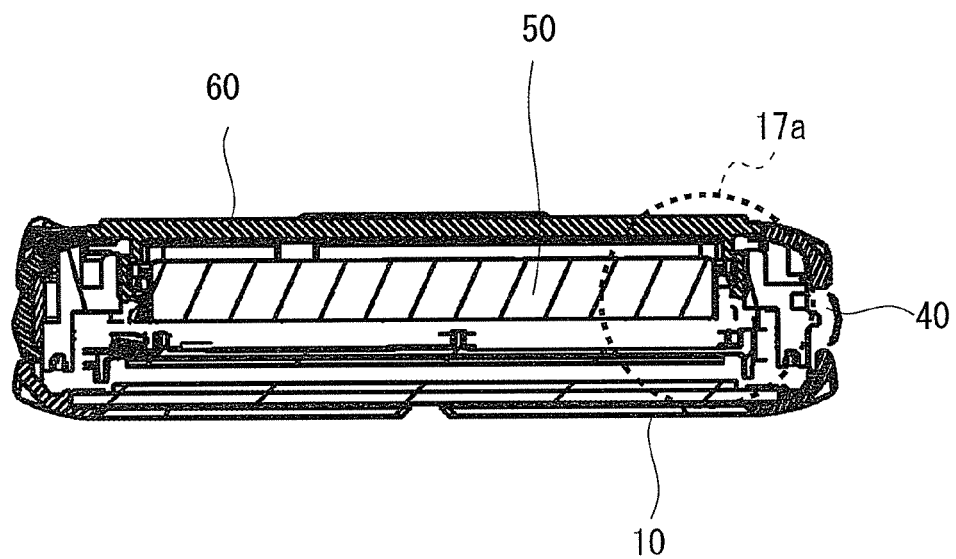
FIG. 16A is a schematic cross-sectional view of the smartphone according to the first embodiment.
Figure 16B:
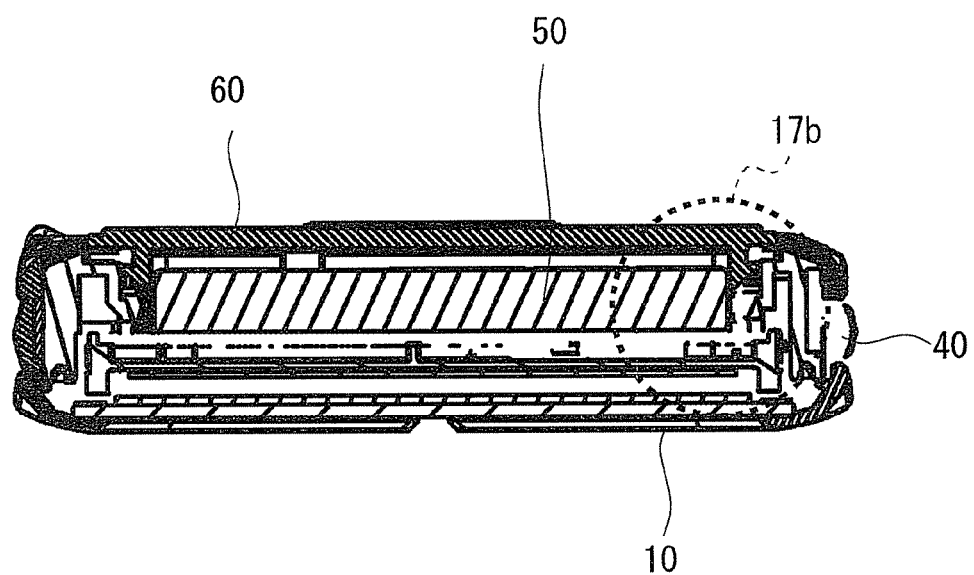
FIG. 16B is a schematic cross-sectional view of the smartphone according to the first embodiment.
Figure 17A:
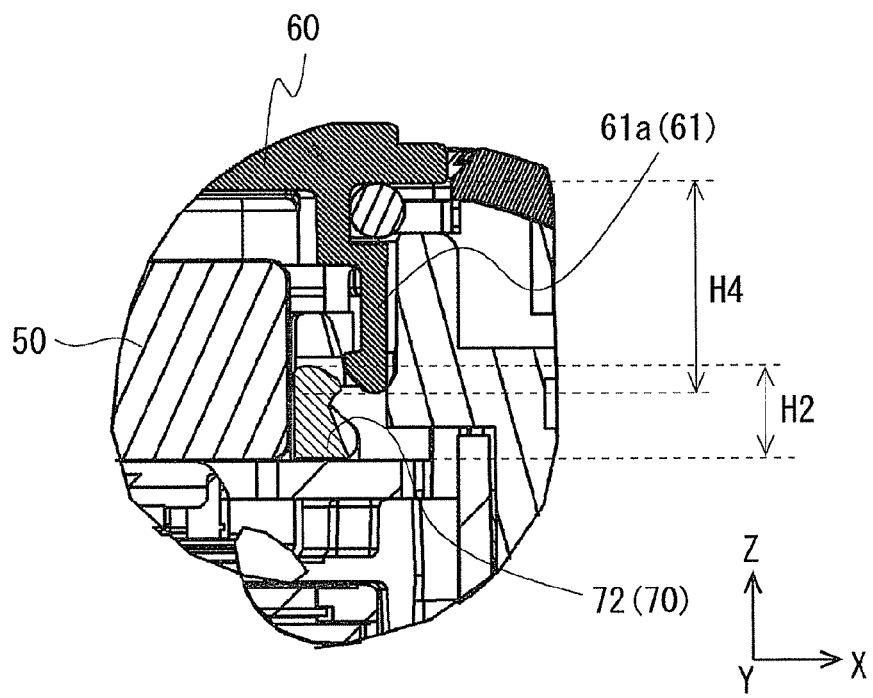
FIG. 17A is a schematic partially enlarged cross-sectional view of the smartphone according to the first embodiment.
Figure 17B:
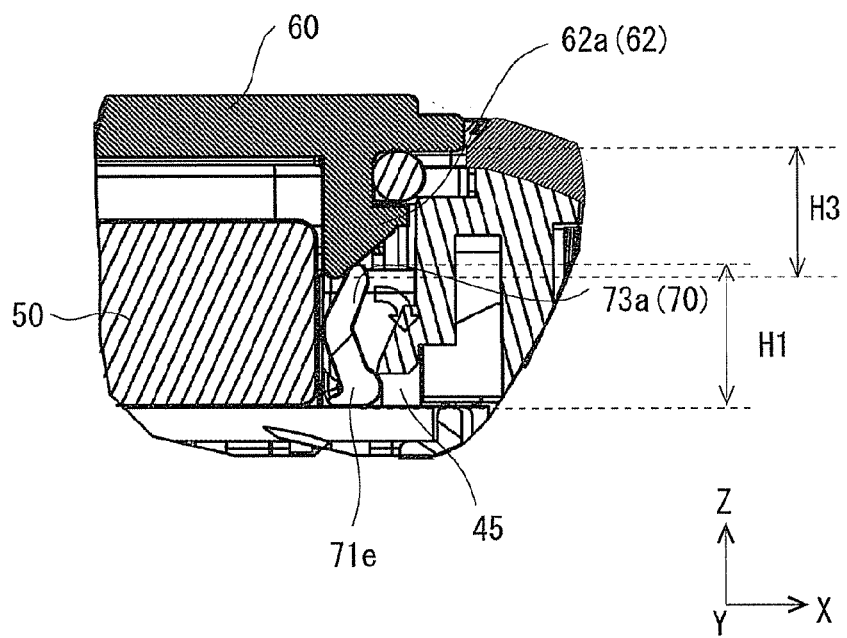
FIG. 17B is a schematic partially enlarged cross-sectional view of the smartphone according to the first embodiment.

The process of the battery cover 60 being pushed into the bottom case assembly 40 is shown in FIGS. 15 to 17B. Note that FIG. 16A is a schematic cross-sectional view taken along XVIA-XVIA in FIG. 15, and FIG. 16B is a schematic cross-sectional view taken along XVIB-XVIB in FIG. 15. FIG. 17A is a schematic enlarged view of the area around a dashed circle 17a shown in FIG. 16A, and FIG. 17B is a schematic enlarged view of the area around a dashed circle 17b shown in FIG. 16B.

Figure 18:
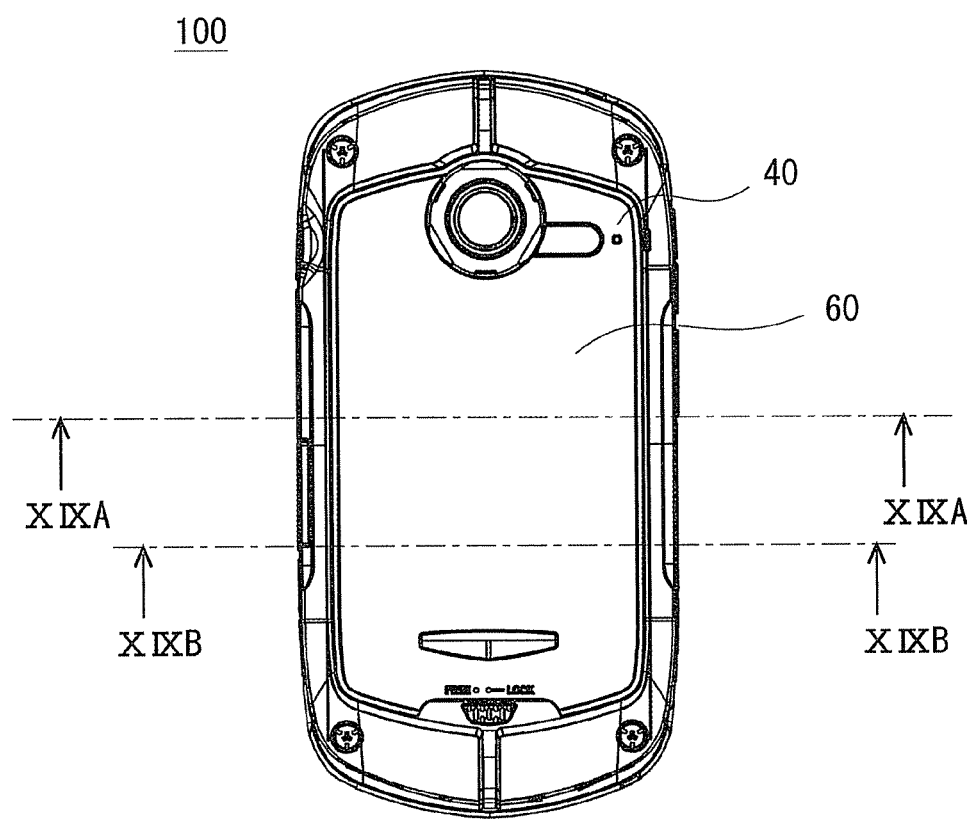
FIG. 18 is a schematic rear view of the smartphone after the battery cover according to the first embodiment is attached.
Figure 19A:
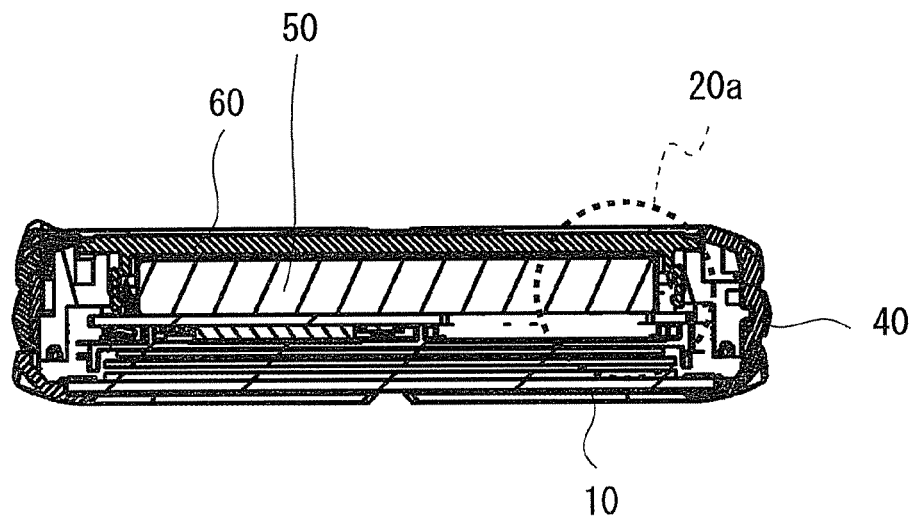
FIG. 19A is a schematic cross-sectional view of the smartphone according to the first embodiment.
Figure 19B:
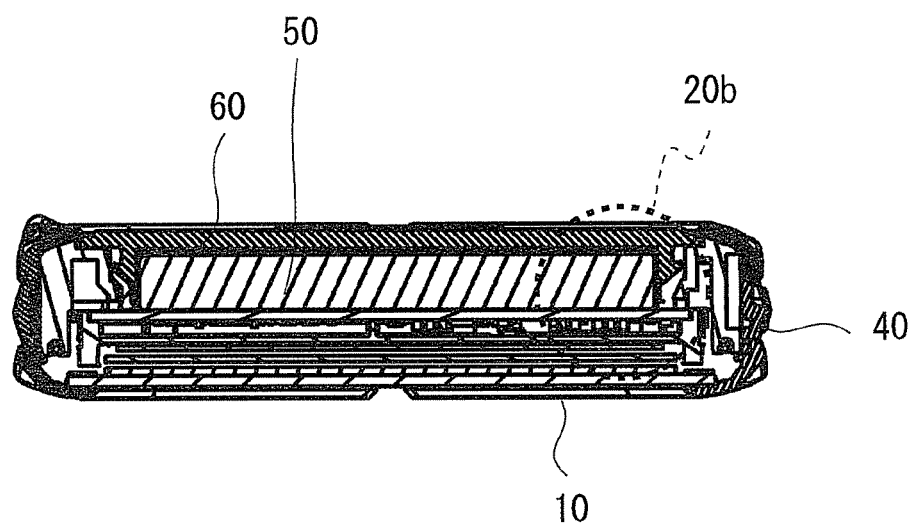
FIG. 19B is a schematic cross-sectional view of the smartphone according to the first embodiment.
Figure 20A:
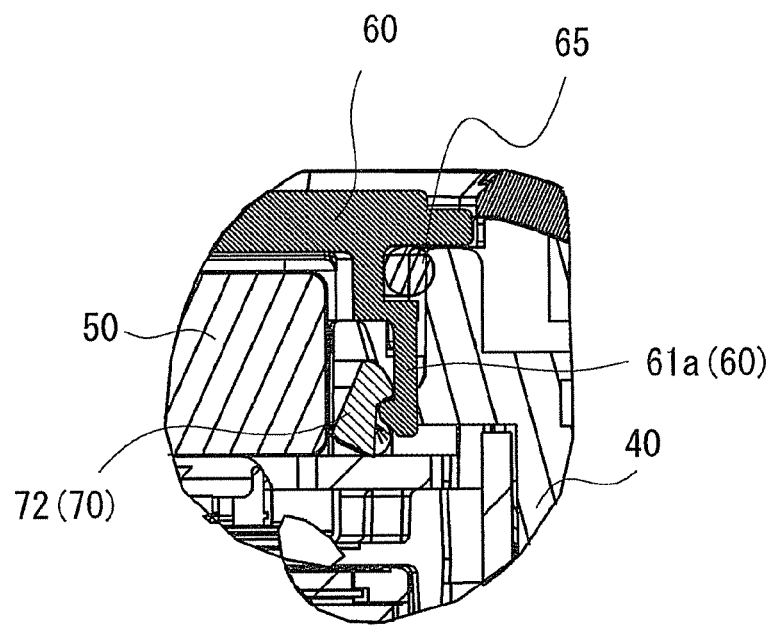
FIG. 20A is a schematic partially enlarged cross-sectional view of the smartphone according to the first embodiment.
Figure 20B:
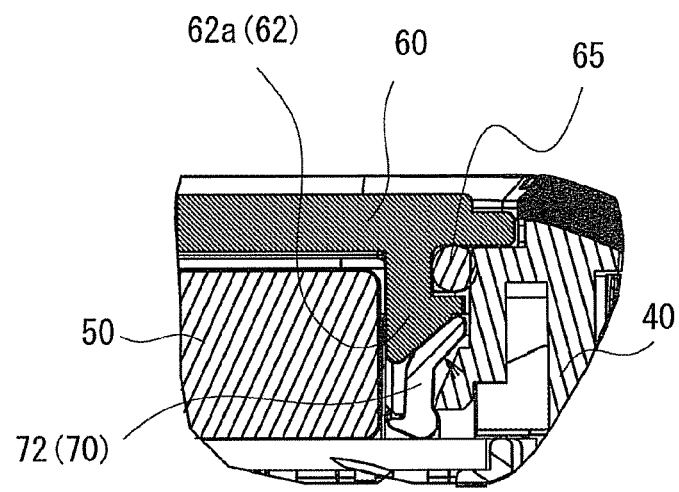
FIG. 20B is a schematic partially enlarged cross-sectional view of the smartphone according to the first embodiment.

The state after the battery cover 60 is pushed into the bottom case assembly 40 is shown in FIGS. 18 to 20B. Note that FIG. 19A is a schematic cross-sectional view taken along XIXA-XIXA in FIG. 18, and FIG. 19B is a schematic cross-sectional view taken along XIXB-XIXB in FIG. 18. FIG. 20A is a schematic enlarged view of the area around a dashed circle 20a shown in FIG. 19A, and FIG. 20B is a schematic enlarged view of the area around a dashed circle 20b in FIG. 19B.

As shown in FIG. 14A, before the battery cover 60 is pushed into the bottom case assembly 40, the locking member 70 is in the standing state on the bottom face 45. As shown in FIG. 14A, the standing direction (i.e., the extending direction) of the hook portion 72 of the locking member 70 substantially agrees with the z axis (i.e., the thickness direction of the battery pack 50). As shown in FIG. 14B, the bent portion 73c of the receiving portion 73 of the locking member 70 is in close proximity to the outer circumferential side face of the battery pack 50.

When the battery cover 60 is pushed into the bottom case assembly 40, the battery cover 60 is allowed to be locked to the bottom case assembly 40 through the locking member 70 by the following mechanism.

By the battery cover 60 being pushed into the bottom case assembly 40, the battery cover 60 lowers toward the bottom face 45 of the bottom case assembly 40. When the battery cover 60 lowers by a prescribed depth, the projecting portion 62 of the battery cover 60 abuts on the receiving portion 73 of the locking member 70 (see FIG. 17B). As the battery cover 60 further lowers, the receiving portion 73 of the locking member 70 receives a force from the projecting portion 62 of the battery cover 60, and is pushed toward the outer side (in the direction becoming away from the outer circumferential side face of the battery pack 50). As explained above, the rotary shaft of the locking member 70 is pivotally held by the holding portion 46 of the bottom case assembly 40. Accordingly, upon reception of the force from the projecting portion 62 of the battery cover 60, the locking member 70 rotates toward the outer side while maintaining its location, as schematically shown in FIG. 17B. As the battery cover 60 further lowers, the locking member 70 rotates toward further outer side while maintaining its location. Note that the locking member 70 rotating toward the outer side can be understood as the locking member 70 falling toward the outer side.

As shown in FIG. 7 and others, the locking member 70 is a single component in which the receiving portion 73 and the hook portion 72 are integrally provided to the shaft-like portion 71. Accordingly, as explained above, when the receiving portion 73 receives a force from the projecting portion 62 of the battery cover 60 and whereby the locking member 70 tilts to the outer side while maintaining its location, the hook portion 72 integrally provided to the locking member 70 also tilts to the outer side. On the other hand, since the battery cover 60 is previously provided with the hook portion 61, the hook portion 61 also lowers as the battery cover 60 lowers. In the process of the hook portion 72 of the locking member 70 gradually falling toward the outer side, the hook portion 61 of the battery cover 60 gradually lowers (see FIG. 17A).

When the battery cover 60 is fully pushed into the bottom case assembly 40, as shown in FIG. 18B, the projecting portion 62 of the battery cover 60 and the receiving portion 73 of the locking member 70 are brought into surface-to-surface contact with each other. As shown in FIG. 18A, the hook portion 72 of the locking member 70 meshes with the hook portion 61 of the battery cover 60. In this manner, the battery cover 60 is simply locked to the bottom case assembly 40 through the locking member 70. As can be seen from the comparison between FIGS. 14B and 20B, the bent portion 73c of the receiving portion 73 is displaced to the outer side.

According to the present embodiment, by the battery cover 60 being pushed into the bottom case assembly 40, the battery cover 60 is locked to the bottom case assembly 40. Thus, when the user simply presses the battery cover 60 against the bottom case assembly 40, that is, the body of the smartphone 100, the battery cover 60 is automatically locked to the bottom case assembly 40. That is, attaching the battery cover 60 to the bottom case assembly 40 is facilitated. Further, the user will not be forced to carry out the work of locking the locking mechanism after the battery cover 60 is attached to the bottom case assembly 40. Accordingly, it becomes possible to effectively prevent the user from carelessly leaving the cover unlocked, for example. This is a particularly advantageous effect on a smartphone with watertightness as the smartphone according to the present embodiment.

Combining the locking mechanism (i.e., the abutting and engaging structure between the locking member 70 and the battery cover 60) disclosed in the present embodiment and other locking mechanism (e.g., the locking mechanism disclosed in Patent Literature 1), a cover member such as the battery cover can be fixed to the housing more strongly.

According to the present embodiment, the locking member 70 is disposed inside the bottom case assembly 40 and therefore the locking mechanism (i.e., the abutting and engaging structure between the locking member 70 and the battery cover 60) will not appear on the exterior of the smartphone 100. Thus, it becomes possible to effectively prevent the locked state from being released unintentionally. This is a particularly advantageous effect on a smartphone with watertightness as the smartphone according to the present embodiment. Further, at the same time, flexibility in designing the smartphone 100 can be effectively improved.

In the present embodiment, as schematically shown in FIGS. 17A and 17B, a height H1 of the receiving portion 73 of the locking member 70 is set to be higher than a height H2 of the hook portion 72 of the locking member 70, and a height H3 of the projecting portion 62 of the battery cover 60 is set to be lower than a height H4 of the hook portion 61 of the battery cover 60. Thus, the rotation amount of the locking member 70 can be suitably adjusted, and the position where the hook portion of the locking member 70 and that of the battery cover 60 mesh with each other can be adjusted as appropriate. Note that the maximum height H1 of the locking member 70 is equal to or smaller than the thickness of the battery pack 50. Thus, an increase in the thickness of the smartphone 100 associated with disposition of the locking member 70 can be effectively suppressed.

Setting the height H1 of the receiving portion 73 to be higher than the height H2 of the hook portion 72, the locking member 70 can more fully receive the force from the projecting portion 62, and can secure its own rotation amount adequately. The short height H2 of the hook portion 72 can be simply supplemented by increasing the height H4 of the hook portion 61. This makes it possible to secure the adequate rotation amount of the locking member 70 and to allow the battery cover 60 to be more fully drawn toward the bottom case assembly 40 and held thereby.

Note that, as shown in FIG. 18, the ring-like sealing member 65 such as an O ring or the like is previously provided to the battery cover 60 in order to secure watertightness. The sealing member 65 is, for example, an elastically deformable ring-like rubber or the like. In the process of the battery cover 60 being pushed into the bottom case assembly 40, the sealing member 65 deforms between the battery cover 60 and the bottom case assembly 40, and is held between them in this state. Thus, watertightness can be provided to the portion corresponding to the battery cover 60 of the smartphone 100. As explained above, as the adequate rotation amount of the locking member 70 is secured, the battery cover 60 is more fully drawn toward the bottom case assembly 40 and held thereby. This makes it possible to more effectively prevent the watertightness from being impaired. Note that, though the deformed state of the sealing member 65 is not explicitly shown in the drawings, those skilled in the art can equally read it from the drawings.

Figure 23:
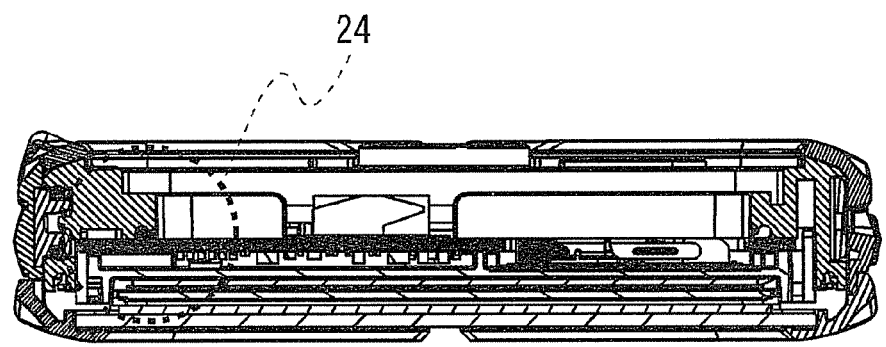
FIG. 23 is a schematic cross-sectional view of the smartphone according to the first embodiment.
Figure 24:
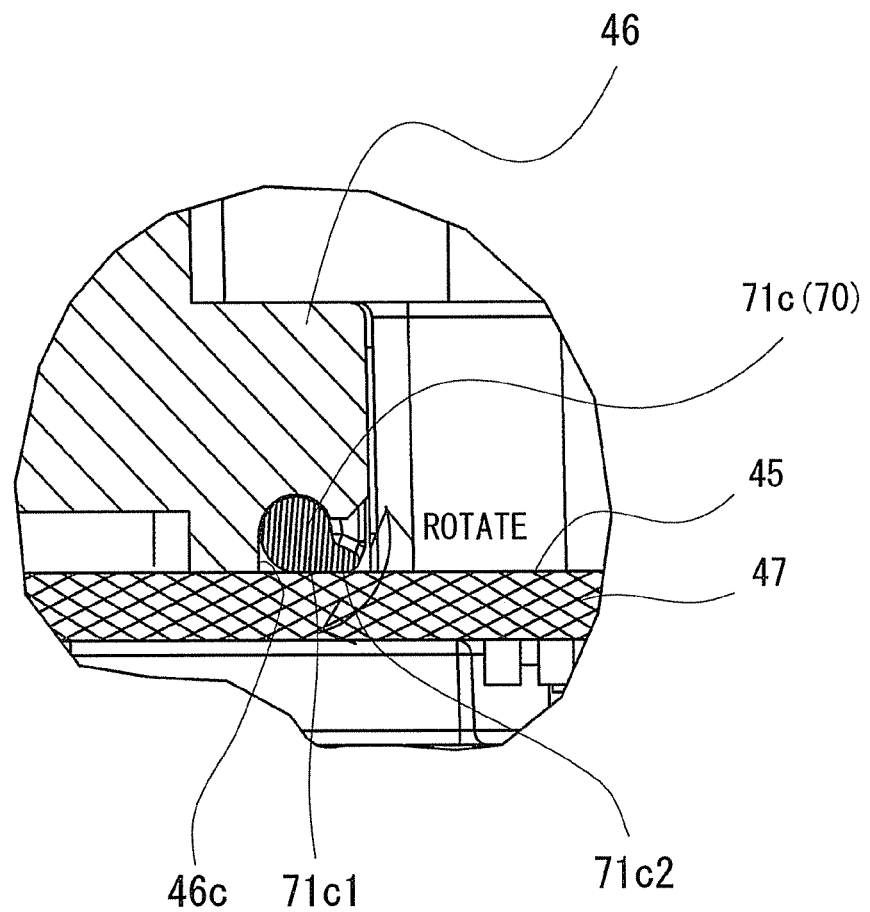
FIG. 24 is a schematic partially enlarged cross-sectional view of the smartphone according to the first embodiment.

With reference to FIGS. 21 to 24, the manner of the bottom case assembly 40 holding the locking member 70 is supplementarily explained. Note that FIG. 23 is a schematic cross-sectional view taken along XXIII-XXIII in FIG. 22. FIG. 24 is a schematic enlarged view of the area around a dashed circle 24 in FIG. 23.

Figure 21:
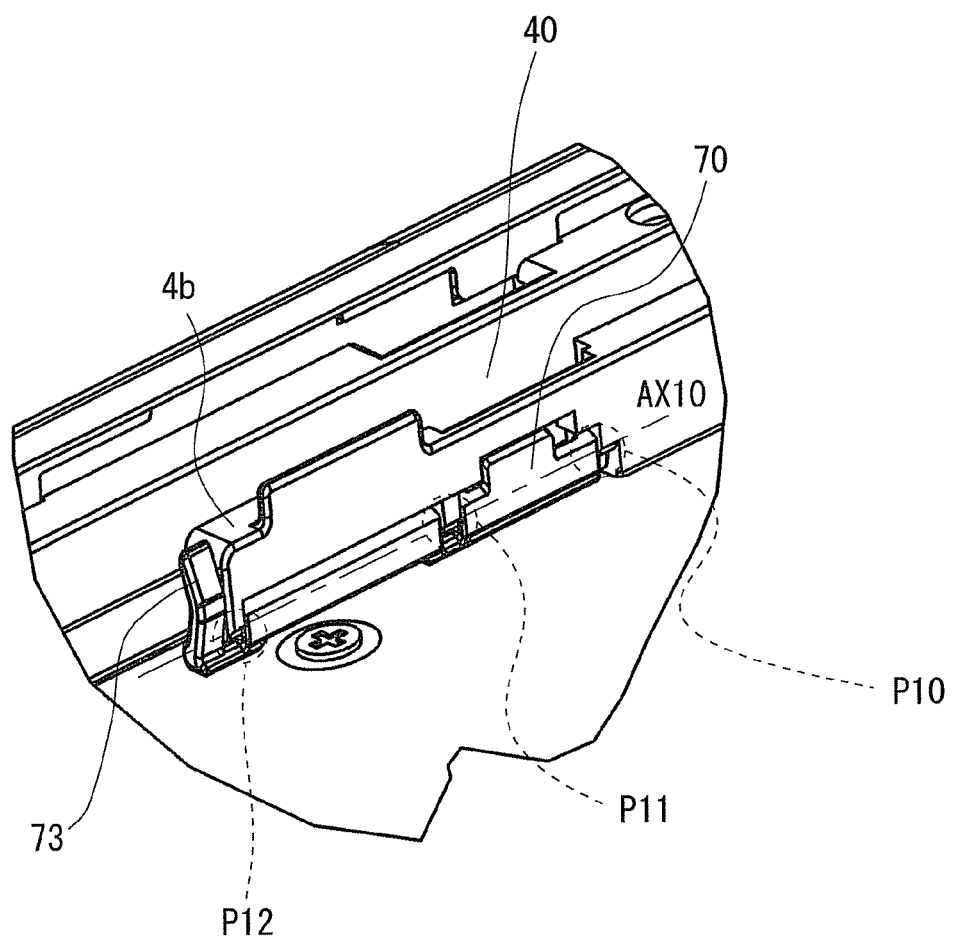
FIG. 21 is an explanatory view showing the state where the locking member according to the first embodiment is pivotally held.
Figure 22:
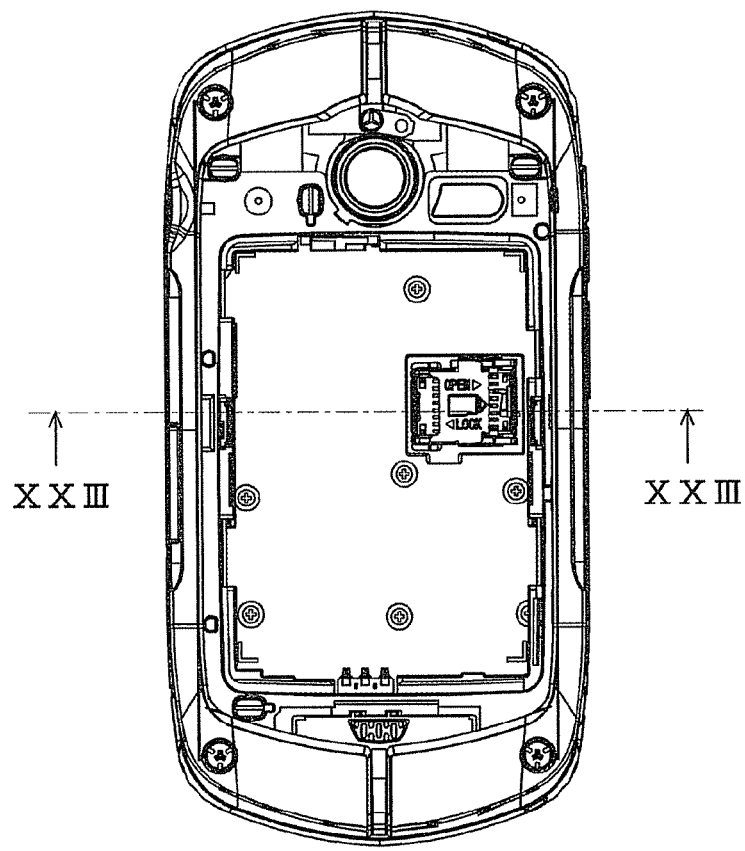
FIG. 22 is a schematic rear view of the smartphone before the battery cover according to the first embodiment is attached.

As shown in FIG. 21, the locking member 70 is pressed downward by the holding portion 46 at three points P10 to P12 and held thereby. Since the locking member 70 is held at a plurality of points, the rotary shaft AX10 of the locking member 70 can be more accurately positioned.

As schematically shown in FIG. 24, the ring-like portion 71c of the locking member 70 is held as being interposed between the holding portion 46 and the substrate 47. The holding portion 46 is previously provided with a receiving portion 46c for receiving the ring-like portion 71c of the locking member 70. Though the height of the entrance of the receiving portion 46c is smaller than the diameter of the circular portion 71c1, the ring-like portion 71c can be easily pushed into the receiving portion 46c because the holding portion 46 and the substrate 47 are made as separate members. By the projection 71c2 provided to the circular portion 71c1 abutting on the entrance portion of the holding portion 46, the rotation of the locking member 70 in the counterclockwise direction, when FIG. 24 is seen from the front, is restricted. By the projection 71c2 provided to the circular portion 71c1 abutting on the substrate 47, the rotation of the locking member 70 in the clockwise direction, when FIG. 24 is seen from the front, is restricted.

According to the present embodiment, the locking member 70 is attached to the bottom case assembly 40 by being pushed into the bottom case assembly 40. This can avoid complication associated with assembling the locking mechanism to the smartphone 100.

According to the present embodiment, the projections that function as the rotation restriction portions to the locking member 70 are provided. Thus, the rotation range of the locking member 70 can be suitably restricted, and it becomes possible to effectively prevent impairment of the locking operation itself by an unexpected rotation of the locking member 70.

Note that the battery cover 60 can be easily removed from the bottom case assembly 40 by being forcibly pulled from the battery cover 60. Any method can be employed for assembling the smartphone 100, and those skilled in the art can easily understand the method from the drawings of the present application.

The present invention is not limited to the embodiment explained above, and can be changed as appropriate within the range not departing from the gist of the present invention. For example, the present invention is applicable also to electronic devices (such as tablet terminals, sheet computers, mobile personal computers, PHSs, PDAs) other than smartphones. The specific shape of the hook portions meshing with each other may be arbitrarily selected. The specific shape of the locking member 70 may be arbitrarily selected. The disposition position of the locking member 70 in the bottom case assembly 40 may be arbitrarily selected. The number of pieces of the locking member 70 provided to the bottom case assembly 40 may be arbitrarily selected.

The foregoing embodiment can be partially or wholly described as in the following appendixes. However, it is not limited to the following appendixes.

(Appendix 1)

An electronic device including: a cover member that is attached to a body; and a locking member that is rotatably held by the body, the locking member rotating in accordance with a force received from the cover member to engage with the cover member, wherein the engagement of the locking member with the cover member allows the cover member to be locked to the body through the locking member.

(Appendix 2)

The electronic device according to Appendix 1, wherein the locking member includes a receiving portion that receives the force from the cover member and an engaging portion that engages with the cover member.

(Appendix 3)

The electronic device according to Appendix 1 or 2, wherein the cover member includes a pressing portion that applies the force to the locking member and an engaging portion that engages with the engaging portion of the locking member in accordance with the pressing portion abutting on the locking member.

(Appendix 4)

The electronic device according to any one of Appendixes 1 to 3, wherein the locking member includes a receiving portion that receives the force from the cover member and an engaging portion that engages with the cover member. The locking member extends in its longitudinal direction, the longitudinal direction being perpendicular to a push-in direction of the cover member relative to the body. The receiving portion and the engaging portion of the locking member are disposed in turn along the extending direction of the locking member.

(Appendix 5)

The electronic device according to any one of Appendixes 1 to 4, wherein the cover member includes a pressing portion that applies the force to the locking member and an engaging portion that engages with the engaging portion of the locking member in accordance with the pressing portion abutting on the locking member. The locking member extends in its longitudinal direction, the longitudinal direction being perpendicular to a push-in direction of the cover member relative to the body. The pressing portion and the engaging portion of the cover member are disposed in turn along the extending direction of the locking member.

(Appendix 6)

The electronic device according to any one of Appendixes 1 to 5, further including a battery pack that is enclosed in a storage space in the body by the cover member, wherein the locking member rotates in a direction becoming away from the battery pack in accordance with contact with the cover member.

(Appendix 7)

The electronic device according to any one of Appendixes 1 to 6, further including a battery pack that is enclosed in a storage space in the body by the cover member, wherein a height of the locking member along a push-in direction of the cover member of the body is smaller than a thickness of the battery pack along the push-in direction.

(Appendix 8)

The electronic device according to any one of Appendixes 1 to 7, further including a battery pack that is enclosed in a storage space of the body by the cover member, wherein the locking member extends along an outer circumferential side face of the battery pack.

(Appendix 9)

The electronic device according to any one of Appendixes 1 to 8, wherein the locking member is rotatably held by the body at a plurality of points that are away from one another along an extending direction of the locking member.

(Appendix 10)

The electronic device according to any one of Appendixes 1 to 9, wherein the locking member is rotatably held by the body by being fitted into a space that is previously provided to the body.

In the foregoing, while the present invention has been described in terms of an embodiment, the present invention is not limited thereby. Various modifications, which can be understood by those skilled in the art, can be made to the configuration or details of the present invention within the scope of the present invention.

The present application claims priority to Japanese Patent Application No. 2011-038971, filed on Feb. 24, 2011, the disclosure of which is incorporated herein in its entirety.

REFERENCE SIGNS LIST 10 top case assembly
20 display assembly
30 circuit board assembly
40 bottom case assembly
50 battery pack
60 battery cover
61 hook portion
62 projecting portion
63 convex portion
65 sealing member
70 locking member
71 shaft-like portion
72 hook portion

The invention claimed is:

1. An electronic device comprising:
a cover member that is attached to a body; and
a locking member that is rotatably held by the body, the locking member rotating in accordance with a force received from the cover member to engage with the cover member,
wherein the engagement of the locking member with the cover member allows the cover member to be locked to the body through the locking member,
the locking member extends in a longitudinal direction, the longitudinal direction being perpendicular to a push-in direction of the cover member relative to the body, and
the locking member is rotatable around an axis, the axis being parallel to the longitudinal direction of the locking member.

2. The electronic device according to claim 1, wherein the locking member includes a receiving portion that receives the force from the cover member and an engaging portion that engages with the cover member.

3. The electronic device according to claim 1, wherein the cover member includes a pressing portion that applies the force to the locking member and an engaging portion that engages with the engaging portion of the locking member in accordance with the pressing portion abutting on the locking member.

4. The electronic device according to claim 1, wherein
the locking member includes a receiving portion that receives the force from the cover member and an engaging portion that engages with the cover member,
the locking member extends in its longitudinal direction, the longitudinal direction being perpendicular to a push-in direction of the cover member relative to the body, and
the receiving portion and the engaging portion of the locking member are disposed in turn along the extending direction of the locking member.

5. The electronic device according to claim 1, wherein
the cover member includes a pressing portion that applies the force to the locking member and an engaging portion that engages with the engaging portion of the locking member in accordance with the pressing portion abutting on the locking member,
the locking member extends in its longitudinal direction, the longitudinal direction being perpendicular to a push-in direction of the cover member relative to the body, and
the pressing portion and the engaging portion of the cover member are disposed in turn along the extending direction of the locking member.

6. The electronic device according to claim 1, further comprising a battery pack that is enclosed in a storage space in the body by the cover member, wherein the locking member rotates in a direction becoming away from the battery pack in accordance with contact with the cover member.

7. The electronic device according to claim 1, further comprising a battery pack that is enclosed in a storage space in the body by the cover member, wherein a height of the locking member along a push-in direction of the cover member of the body is smaller than a thickness of the battery pack along the push-in direction.

8. The electronic device according to claim 1, further comprising a battery pack that is enclosed in a storage space of the body by the cover member, wherein the locking member extends along an outer circumferential side face of the battery pack.

9. The electronic device according to claim 1, wherein the locking member is rotatably held by the body at a plurality of points that are away from one another along an extending direction of the locking member.

10. The electronic device according to claim 1, wherein the locking member is rotatably held by the body by being fitted into a space that is previously provided to the body.

* * * * *